(12) United States Patent
Shi et al.

(10) Patent No.: US 12,520,626 B2
(45) Date of Patent: Jan. 6, 2026

(54) FLIP-CHIP LIGHT EMITTING DIODE AND LIGHT EMITTING DEVICE

(71) Applicant: Quanzhou sanan semiconductor technology Co., Ltd., Fujian (CN)

(72) Inventors: Baojun Shi, Fujian (CN); Jin Xu, Fujian (CN); Dazhong Chen, Fujian (CN); Shuijie Wang, Fujian (CN); Ke Liu, Fujian (CN); Qiang Wang, Fujian (CN); Meijian Wu, Fujian (CN)

(73) Assignee: Quanzhou sanan semiconductor technology Co., Ltd., Fujian (CN)

( * ) Notice: Subject to any disclaimer, the term of this patent is extended or adjusted under 35 U.S.C. 154(b) by 369 days.

(21) Appl. No.: 18/346,863

(22) Filed: Jul. 5, 2023

(65) Prior Publication Data

US 2024/0063336 A1 Feb. 22, 2024

(30) Foreign Application Priority Data

Aug. 17, 2022 (CN) .......................... 202210986847.6

(51) Int. Cl.
*H10H 20/815* (2025.01)
*H10H 20/814* (2025.01)
*H10H 20/816* (2025.01)

(52) U.S. Cl.
CPC ........ *H10H 20/815* (2025.01); *H10H 20/814* (2025.01); *H10H 20/816* (2025.01)

(58) Field of Classification Search
CPC . H10H 20/814–816; H10H 20/83–835; H10H 20/8506
See application file for complete search history.

(56) References Cited

U.S. PATENT DOCUMENTS

| 7,042,018 B2 * | 5/2006 | Tu ........................ H10H 20/815 |
| | | 257/97 |
| 2006/0081869 A1 * | 4/2006 | Lu ........................ H10H 20/835 |
| | | 257/E33.068 |

(Continued)

FOREIGN PATENT DOCUMENTS

| CN | 208111472 | 11/2018 |
| CN | 113555481 | 10/2021 |
| CN | 114388667 | 4/2022 |

OTHER PUBLICATIONS

"Office Action of China Counterpart Application", issued on Sep. 26, 2022, p. 1-p. 14.

*Primary Examiner* — Andres Munoz
(74) *Attorney, Agent, or Firm* — JCIPRNET

(57) ABSTRACT

A flip-chip light emitting diode includes an epitaxial structure, a first electrode, and a second electrode. The epitaxial structure includes a first semiconductor layer, a light emitting layer, and a second semiconductor layer. The light emitting layer is located between the first semiconductor layer and the second semiconductor layer. The first electrode is located on the epitaxial structure and is electrically connected to the first semiconductor layer. The second electrode is located on the epitaxial structure and is electrically connected to the second semiconductor layer. The first electrode and/or the second electrode is a multilayer metal structure. The multilayer metal structure includes a metal reflective layer, a first barrier layer, and a conductive metal layer stacked in sequence on the first semiconductor layer. A thickest layer in the multilayer metal structure is the conductive metal layer, and the conductive metal layer is an Al layer.

15 Claims, 3 Drawing Sheets

(56) References Cited

U.S. PATENT DOCUMENTS

| | | | |
|---|---|---|---|
| 2010/0308366 A1* | 12/2010 | Kang | H10H 20/835 |
| | | | 257/E33.013 |
| 2011/0018022 A1* | 1/2011 | Okabe | H10H 20/835 |
| | | | 438/31 |
| 2013/0181244 A1* | 7/2013 | Sato | H10H 20/835 |
| | | | 257/98 |
| 2018/0182921 A1* | 6/2018 | Jang | H10H 20/857 |

* cited by examiner

FLIP-CHIP LIGHT EMITTING DIODE AND LIGHT EMITTING DEVICE

CROSS-REFERENCE TO RELATED APPLICATION

This application claims the priority benefit of China application serial no. 202210986847.6, filed on Aug. 17, 2022. The entirety of the above-mentioned patent application is hereby incorporated by reference herein and made a part of this specification.

BACKGROUND

Technical Field

The disclosure relates to the technical field of semiconductor manufacturing, and in particular, relates to a flip-chip light emitting diode and a light emitting device.

Description of Related Art

A light emitting diode (LED) is a semiconductor light emitting element and is made of semiconductors such as GaN, GaAs, GaP, GaAsP, etc. most of the time. The core of a light emitting diode is a PN junction with light emitting properties. LED has the advantages of high luminous intensity, high efficiency, small size, and long service life, and is considered to be one of the most potential light sources at present. For instance, light emitting diodes used as pixels of a light emitting device may replace a conventional liquid crystal light emitting device, and the display effect of higher image quality is achieved.

At present, a conventional flip-chip LED chip includes a contact electrode for internal electrical contact and a pad electrode for external soldering. The pad electrode can fix the flip-chip LED chip on the packaging substrate by brushing solder paste and the reflow soldering process. Alternatively, the pad electrode is directly made into a tin electrode, and the flip-chip LED chip may be fixed onto the packaging substrate directly through the reflow soldering process. In the internal contact electrode structure, an Au layer with a thickness of approximately 1 um will be inserted to improve the overall electrical and thermal conductivity of the chip, which is mainly due to the favorable electrical and thermal conductivity of the Au electrode. However, Au has a lower tensile strength. After the LED chip is mounted on the packaging substrate in the subsequent use process, the force generated by some shape deformation of the packaging substrate will be transmitted to the inside of the LED chip, resulting in a large stress on the electrode, especially a large stress on the Au layer, which in turn will cause the force to be transmitted to the inside and cannot be well buffered and released. Problems such as detachment between the electrode and the insulating layer and between the electrode metal layer and the metal layer occurs as a result in the entire LED chip. Therefore, how to address the internal stress buffering and releasing of the LED chip has become one of the technical problems needed to be urgently solved by a person having ordinary skill in the art.

SUMMARY

The disclosure provides a flip-chip light emitting diode including an epitaxial structure, a first electrode, and a second electrode.

The epitaxial structure includes a first semiconductor layer, a light emitting layer, and a second semiconductor layer. The light emitting layer is located between the first semiconductor layer and the second semiconductor layer. The first electrode is located on the epitaxial structure and is electrically connected to the first semiconductor layer. The second electrode is located on the epitaxial structure and is electrically connected to the second semiconductor layer. The first electrode and/or the second electrode is a multilayer metal structure. The multilayer metal structure includes a metal reflective layer, a first barrier layer, and a conductive metal layer stacked in sequence. The metal reflective layer is located between the first semiconductor layer and the first barrier layer. A thickest layer in the multilayer metal structure is the conductive metal layer, and the conductive metal layer is an Al layer.

In some embodiments, the first barrier layer includes at least one metal layer among a Ti layer, a Pt layer, and a Ni layer.

In some embodiments, a thickness of the metal reflective layer is 100 nm to 400 nm, and a thickness of the conductive metal layer is 600 nm to 1800 nm.

In some embodiments, the multilayer metal structure further includes a second barrier layer. The second barrier layer is disposed on a side of the conductive metal layer away from the first barrier layer.

In some embodiments, the second barrier layer includes at least one metal layer among a Ti layer, a Pt layer, and a Ni layer.

In some embodiments, the multilayer metal structure further includes a first adhesive layer and a second adhesive layer. The first adhesive layer is located on a side of the metal reflective layer away from the first barrier layer. The second adhesive layer is located on a side of the second barrier layer away from the conductive metal layer.

In some embodiments, the first adhesive layer includes at least one metal layer between a Cr layer and a Ti layer. The second adhesive layer includes at least one metal layer between a Cr layer and a Ti layer. A thickness of the first adhesive layer ranges from 0.1 nm to 10 nm, and a thickness of the second adhesive layer ranges from 10 nm to 50 nm.

In some embodiments, the flip-chip light emitting diode further includes an insulating layer. The insulating layer covers the epitaxial structure and has a first opening and a second opening.

In some embodiments, the flip-chip light emitting diode further includes a first pad and a second pad. The first pad is located on the insulating layer and is electrically connected to the first electrode through the first opening. The second pad is located on the insulating layer and is electrically connected to the second electrode through the second opening.

In some embodiments, a transparent current spreading layer is disposed under the second electrode.

In some embodiments, a size of the flip-chip light emitting diode is less than or equal to 200 μm.

In some embodiments, the Al layer is a pure Al layer or an Al alloy layer.

In some embodiments, the first electrode and/or the second electrode has an extension portion, and the extension portion is strip-shaped.

In some embodiments, the multilayer metal structure includes a plurality of Ti layers located in the first barrier layer, and thicknesses of the plurality of Ti layers gradually increase in a direction from bottom to top.

The disclosure further provides a light emitting device including the light emitting diode according to any one of the above.

The disclosure provides a flip-chip light emitting diode and a light emitting device. One of the advantages of the disclosure is that, by using the thickest layer in the multilayer metal structure as the conductive metal layer (Al layer) with high tensile strength, the internal thermal stress of the light emitting diode during subsequent use may be well buffered and released. Further, the current spreading in the horizontal direction is facilitated, and reliability of the device is thus improved.

Additional features and advantages of the disclosure will be set forth in the following specification, and in part will be apparent from the specification or can be learned by practice of the disclosure. The objects and other beneficial effects of the disclosure can be achieved and obtained through the structures specifically pointed out in the specification, claims, and the like.

BRIEF DESCRIPTION OF THE DRAWINGS

To make the technical solutions provided in the embodiments of the disclosure or the related art more clearly illustrated, several accompanying drawings required by the embodiments or the related art for description are briefly introduced as follows. Obviously, the drawings in the following description are some embodiments of the disclosure, and for a person having ordinary skill in the art, other drawings can be obtained based on these drawings without inventive effort. In the following description, the positional relationship described in the accompanying drawings is based on the direction in which the components are drawn in the drawings, unless otherwise specified.

REFERENCE NUMERALS

Figure 1:
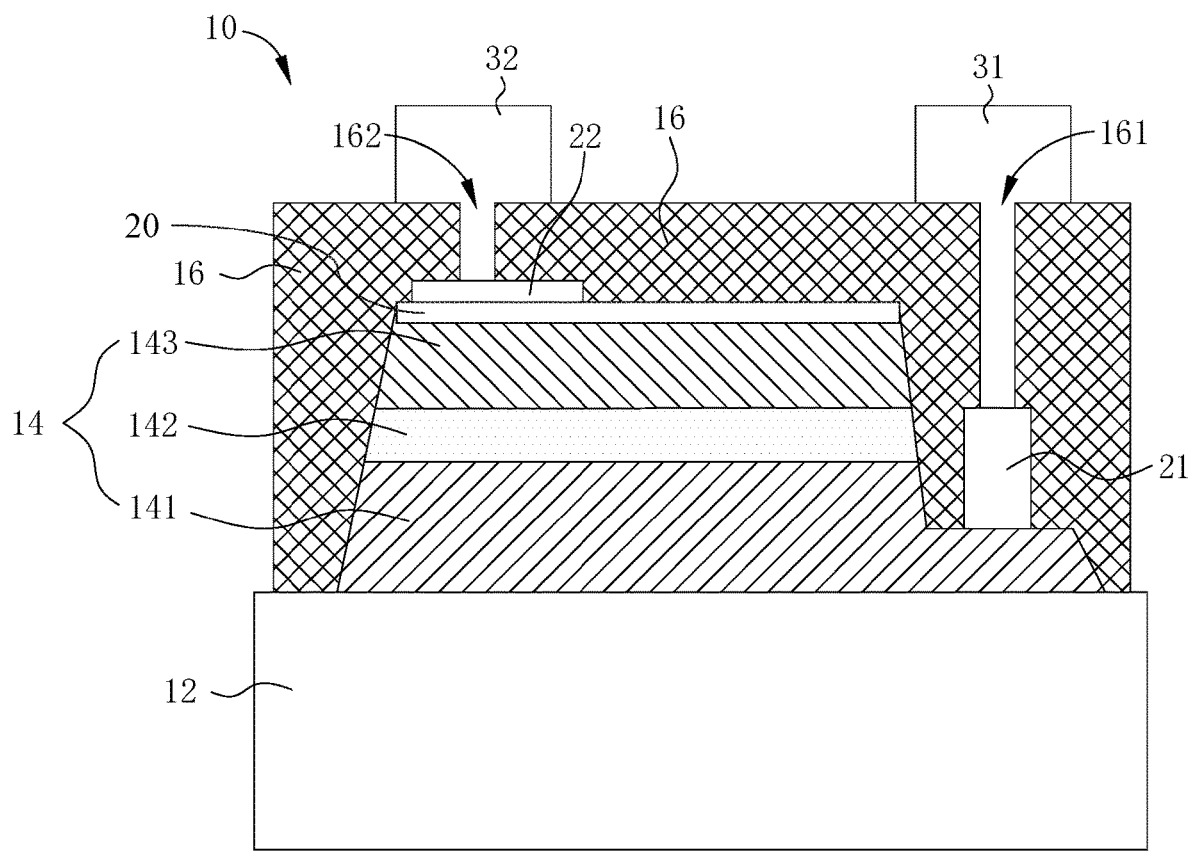
FIG. 1 is a schematic diagram of a structure of a light emitting diode according to an embodiment of the disclosure.

10: light emitting diode, 12: substrate, 14: epitaxial structure, 141: first semiconductor layer, 142: light emitting layer, 143: second semiconductor layer, 16: insulating layer, 161: first opening, 162: second opening, 21: first electrode, 22: second electrode, 31: first pad, 32: second pad, 41: first adhesive layer, 42: metal reflective layer, 43: first barrier layer, 46: conductive metal layer, 47: second barrier layer, and 48: second adhesive layer.

DESCRIPTION OF THE EMBODIMENTS

In order to make the objectives, technical solutions, and advantages of the embodiments of the disclosure clearer, description will now be made in detail to clearly and completely present preferred embodiments of the disclosure, examples of which are illustrated in the accompanying drawings. Nevertheless, the disclosed embodiments are merely part of the embodiments of the disclosure, not all the embodiments. The technical features designed in the different embodiments of the disclosure described below can be combined with each other as long as the technical features do not conflict with each other. Based on the embodiments of the disclosure, all other embodiments obtained by a person having ordinary skill in the art without making any inventive effort fall within the scope that the disclosure seeks to protect.

In the description of the disclosure, it should be understood that the terms "center", "lateral", "up", "down", "left", "right", "vertical", "horizontal", "top", "bottom", "inner", "outer", and other indication orientations or positional relationships are based on the orientations and positional relationships shown in the drawings, are provided to facilitate the description of the disclosure and simplify the description, and are not intended to indicate or imply that the indicated device or component must have a specific orientation or be constructed and operated in a specific orientation, so cannot be understood as limiting the disclosure. Further, the terms "first" and "second" are only used for descriptive purposes and cannot be understood as indicating or implying relative importance or implicitly indicating the number of indicated technical features. Thus, the features defined with "first" and "second" may explicitly or implicitly include one or more of these features. In the description of the disclosure, unless otherwise specified, "plurality" means two or more than two. In addition, the term "comprising" and any variations thereof mean "comprising at least".

Figure 2:
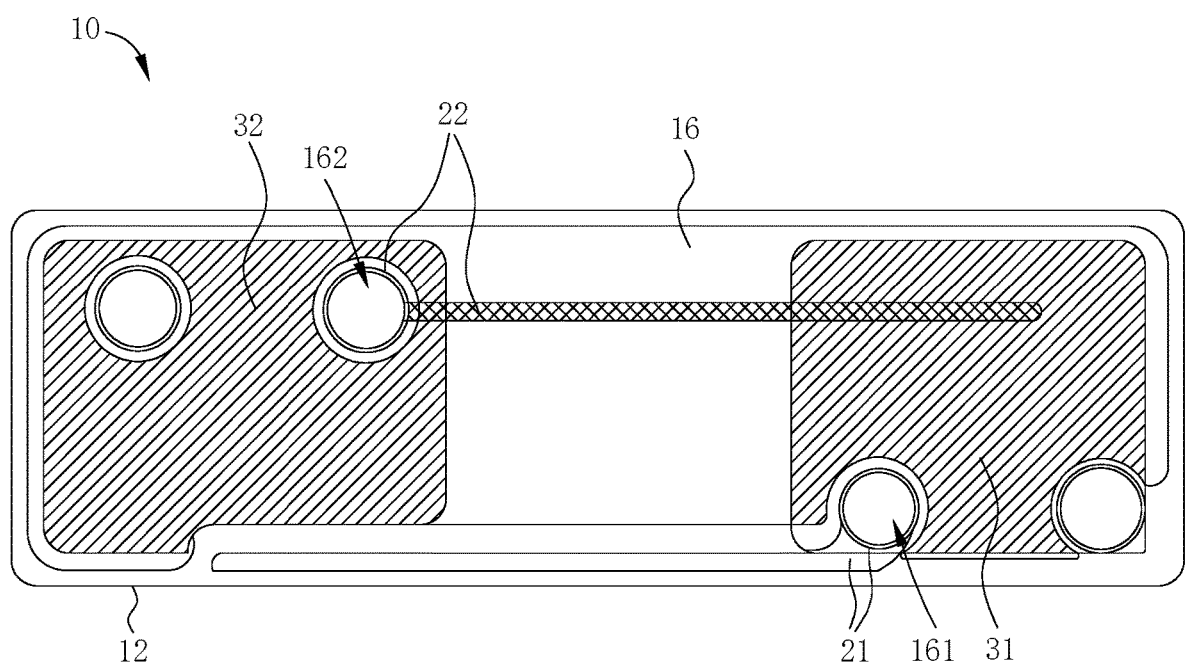
FIG. 2 is a schematic top view of the light emitting diode according to an embodiment of the disclosure.
Figure 3:
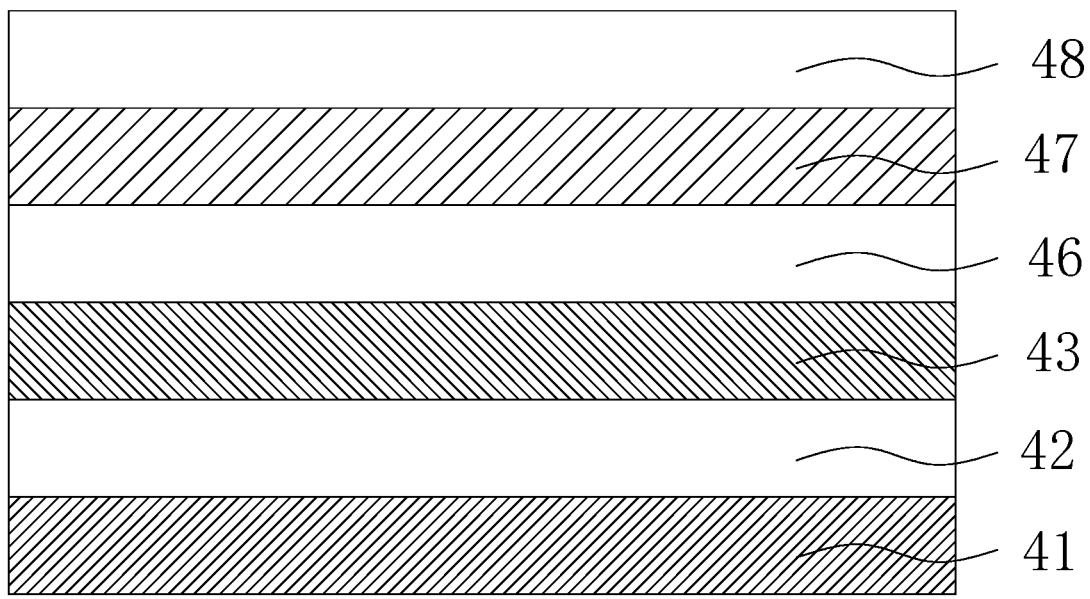
FIG. 3 is a schematic diagram of a structure of a multilayer metal structure.

With reference to FIG. 1, FIG. 2, and FIG. 3, FIG. 1 is a schematic diagram of a structure of a flip-chip light emitting diode 10 according to an embodiment of the disclosure, FIG. 2 is a schematic top view of the flip-chip light emitting diode 10 according to an embodiment of the disclosure, and FIG. 3 is a schematic diagram of a structure of a multilayer metal structure. In order to achieve at least one of the advantages or other advantages, an embodiment of the disclosure provides a flip-chip light emitting diode 10. As shown in the drawings, the flip-chip light emitting diode 10 may include an epitaxial structure 14, a first electrode 21, a second electrode 22, an insulating layer 16, a first pad 31, and a second pad 32.

The epitaxial structure 14 is disposed on a substrate 12. The substrate 12 may be an insulating substrate, and preferably, the substrate 12 may be made of a transparent material or a translucent material. In the illustrated embodiment, the substrate 12 is a sapphire substrate. In some embodiments, the substrate 12 may be a patterned sapphire substrate, but the disclosure is not limited thereto. The substrate 12 may also be made of a conductive material or a semiconductor material. For instance, the material of the substrate 12 may include at least one of silicon carbide, silicon, magnesium aluminum oxide, magnesium oxide, lithium aluminum oxide, aluminum gallium oxide, and gallium nitride.

The epitaxial structure 14 includes a first semiconductor layer 141, a light emitting layer 142, and a second semiconductor layer 143. The light emitting layer 142 is located between the first semiconductor layer 141 and the second semiconductor layer 143. That is, the first semiconductor layer 141, the light emitting layer 142, and the second semiconductor layer 143 are sequentially stacked on the substrate 12.

The first semiconductor layer 141 may be an N-type semiconductor layer and is able to provide electrons to the light emitting layer 142 under the action of a power source. In some embodiments, the first semiconductor layer 141 includes an N-type doped nitride layer. The N-type doped nitride layer may include one or more N-type impurities of Group IV elements. The N-type impurities may include one of Si, Ge, Sn, or a combination thereof.

The light emitting layer 142 may be a quantum well (QW) structure. In some embodiments, the light emitting layer 142 may also be a multiple quantum well (MQW) structure, and the multiple quantum well includes multiple quantum well layers and multiple quantum barrier layers arranged in a repeated and alternating manner, for example, it may be a multiple quantum well structure of GaN/AlGaN, InAlGaN/InAlGaN, or InGaN/AlGaN. In addition, the composition and thickness of the well layer in the light emitting layer 142 determine the wavelength of the generated light. By changing the depth of the quantum wells, the number of pairs of quantum wells and quantum barriers, the thickness and/or other features in the light emitting layer 142, the luminous efficiency of the light emitting layer 142 may be improved.

The second semiconductor layer 143 may be a P-type semiconductor layer and can provide holes to the light emitting layer 142 under the action of a power supply. In some embodiments, the second semiconductor layer 143 includes a P-type doped nitride layer. The P-type doped nitride layer may include one or more P-type impurities of Group II elements. The P-type impurities may include one of Mg, Zn, Be, or a combination thereof. The second semiconductor layer 143 may be a single layer structure or a multilayer structure with different compositions. In addition, the arrangement of the epitaxial structure 14 is not limited thereto, and other types of epitaxial structures 14 may be selected according to actual needs.

The first electrode 21 is located on the epitaxial structure 14 and is electrically connected to the first semiconductor layer 141. The second electrode 22 is located on the epitaxial structure 14 and is electrically connected to the second semiconductor layer 143. In some embodiments, a transparent current spreading layer 20 may also be provided under the second electrode 22, so that the conductivity performance is further improved, and the photoelectric property of the flip-chip light emitting diode 10 is enhanced. The transparent current spreading layer 20 may be an ITO layer or an ITO layer doped with aluminum.

The insulating layer 16 covers the epitaxial structure 14 and may also cover a portion of the first electrode 21 and a portion of the second electrode 22. The insulating layer 16 has a first opening 161 and a second opening 162, and the first opening 161 and the second opening 162 are respectively located above the first electrode 21 and the second electrode 22.

The insulating layer 16 exhibits different functions depending on the location involved. For instance, when the insulating layer 16 covers a sidewall of the epitaxial structure 14, the insulating layer 16 may be used to prevent the electrical connection between the first semiconductor layer 141 and the second semiconductor layer 143 due to the leakage of the conductive material, so the possibility of abnormal short circuit of the flip-chip light emitting diode 10 is reduced, but the disclosure is not limited thereto. A material of the insulating layer 16 includes a non-conductive material. The non-conductive material is preferably an inorganic material or a dielectric material. The inorganic material may contain silica gel. The dielectric material includes electrical insulating materials such as aluminum oxide, silicon nitride, silicon oxide, titanium oxide, or magnesium fluoride. For instance, the insulating layer 16 may be silicon dioxide, silicon nitride, titanium oxide, tantalum oxide, niobium oxide, barium titanate, or combinations thereof, and the combination thereof may be, for example, a Bragg reflector (DBR) formed by repeated stacking of two materials with different refractive indices.

The first pad 31 is located on the insulating layer 16 and is electrically connected to the first electrode 21 through the first opening 161. The second pad 32 is located on the insulating layer 16 and is electrically connected to the second electrode 22 through the second opening 162. The first pad 31 and the second pad 32 may be metal pads, may be formed together using the same material in the same process, and thus may have the same layer structure.

The first electrode 21 and/or the second electrode 22 is a multilayer metal structure, for example, only the first electrode 21 is a multilayer metal structure, only the second electrode 22 is a multilayer metal structure, or both the first electrode 21 and the second electrode 22 are multilayer metal structures. A multilayer metal structure refers to a stacked structure having multiple metal layers. For blue and green flip-chip light emitting diodes 10, generally, the first electrode 21 and the second electrode 22 are multilayer metal structures and have the same multilayer metal structure. Herein, a thickest layer in the multilayer metal structure is a conductive metal layer 46. The conductive metal layer 46 is an Al layer, and the Al layer exhibits both high tensile strength and excellent electrical conductivity. By using the thickest layer in the multilayer metal structure as the conductive metal layer 46 (Al layer) with high tensile strength, the internal thermal stress of the flip-chip light emitting diode 10 during subsequent use may be well buffered and released, and reliability of the device may thus be improved.

The first electrode 21 may include a base portion (this base portion is used to electrically communicate with the first pad 31) located under the first opening 161 of the insulating layer 16 and an extension portion (used to spread the current horizontally) extending downwards from the bottom of the first opening 161. The extension portion is strip-shaped. The second electrode 22 may include a base portion (this base portion is used to electrically communicate with the second pad 32) located under the second opening 162 of the insulating layer 16 and an extension portion (used to spread the current horizontally) extending downwards from the bottom of the second opening 162. The extension portion is strip-shaped. That is, the first electrode 21 and/or the second electrode 22 may be a current spreading electrode. The strip-shaped design of the extension portion makes the first electrode 21 and the second electrode 22 exhibit the feature of current spreading, and the input and output of current is also improved.

In some embodiments, as shown in FIG. 3, the multilayer metal structure may include a metal reflective layer 42, a first barrier layer 43, and a conductive metal layer 46 stacked in sequence. The metal reflective layer 42 is located between the first semiconductor layer 141 and the first barrier layer 43. That is, the metal reflective layer 42 is closer to the first semiconductor layer 141 than the first barrier layer 43 and the conductive metal layer 46. In other words, the metal reflective layer 42, the first barrier layer 43, and the conductive metal layer 46 are located on the epitaxial structure 14 in sequence in a direction from the first semiconductor layer 141 to the second semiconductor layer 143. The metal reflective layer 42 is mainly used to reflect light (for example, reflect the light emitted by the light emitting layer 142) to enhance the light emitting effect. A thickness of the metal reflective layer 42 may be 100 nm to 400 nm, such as 100 nm to 200 nm, 200 nm to 300 nm, 300 nm to 400 nm and so on. The metal reflective layer 42 shall not be excessively thick, otherwise the stability of the metal reflective layer 42 may be insufficient. The first barrier layer 43 may provide the functions of barrier and protection, for example, the first barrier layer 43 may protect the metal reflective layer 42, protect the layer structure of the metal reflective layer 42 from being corroded by external moisture or being subjected to migration and protect the stability of material reflectivity of the metal reflective layer 42.

In some embodiments, the metal reflective layer 42 may use Al, Ag, and other metals. The Al layer of the conductive metal layer 46 may be a pure Al layer or an Al alloy layer, such as an AlCu alloy layer.

The first barrier layer 43 includes at least one metal layer among a Ti layer, a Pt layer, and a Ni layer. For instance, the first barrier layer 43 may be a Ti layer, may be a combination of a Ti layer and a Ni layer, may be a combination of a Ti layer and a Pt layer, and so on. More preferably, for the first barrier layer 43 formed by the combination of a Ti layer and a Ni layer, to be specific, the Ni layer exhibits good thermal conductivity and good barrier effect. The Ni layer may also be used to buffer the internal stress of the multilayer metal structure to offset the stress between the upper and lower layers of the multilayer metal structure itself, especially the stress of the Al layer (conductive metal layer 46). The Ti layer may act as a stress transition between the metal reflective layer 42 and the Ni layer, and the adhesion of the multilayer metal layers is thus improved. Preferably, a thickness of the single-layer Ni layer may range from 100 nm to 500 nm, and the Ni layer shall not be excessively thick, otherwise the internal stress may be relatively large. A thickness of the single-layer Ti layer may range from 30 nm to 300 nm, and the Ti layer shall not be excessively thick, otherwise the resistance may be relatively large, which is not conducive to the transmission of current. A thickness of the single-layer Pt layer may range from 100 nm to 200 nm, and the Pt layer shall not be excessively thick, otherwise a bottom width of the entire electrode may be excessively large, resulting in severe light absorption, and light emitting property of the flip-chip light emitting diode 10 may be affected. In some embodiments, the bottom-up structure of the first barrier layer 43 may be, for example, a Ti/Pt/Ti layer or a Ti/Ni/Ti layer. The conductive metal layer 46 is an Al layer, so the conductive metal layer 46 may conduct electricity on the one hand, and on the other hand, due to the high tensile strength of the Al layer, the internal stress may further be buffered and released. In order to ensure the conductivity and tensile performance of the conductive metal layer 46, a thickness of the conductive metal layer 46 ranges from 600 nm to 1800 nm, such as 800 nm to 1200 nm or 600 nm to 800 nm. When the thickness of the conductive metal layer 46 is controlled within this range, the resistance is small, its lateral current transmission capability is relatively strong, and the Al layer can further improve the current spreading performance of extension portions of the first electrode 21 and the second electrode 22 (i.e., the first electrode 21 and the second electrode 22 are current spreading electrodes).

In some embodiments, as shown in FIG. 3, the multilayer metal structure may further include a second barrier layer 47. The second barrier layer 47 is disposed on a side of the conductive metal layer 46 away from the first barrier layer 43, that is, the second barrier layer 47 shown in FIG. 3 is located on the conductive metal layer 46. The second barrier layer 47 may provide the functions of barrier and protection, so second barrier layer 47 may protect the layer structure of the underlying conductive metal layer 46 from being corroded by external moisture or being subjected to migration, and overall stability is thus improved.

The second barrier layer 47 includes at least one metal layer among a Ti layer, a Pt layer, and a Ni layer. For instance, the second barrier layer 47 may be a Ti layer, may be a combination of a Ti layer and a Ni layer, may be a combination of a Ti layer and a Pt layer, and so on. The combination of a Ti layer and a Pt layer is preferred, because such a combination is chemically stable and can effectively cover and protect the thicker conductive metal layer 46 below. The thickness of the single-layer Ti layer may range from 30 nm to 300 nm, and the Ti layer shall not be excessively thick, otherwise the resistance may become excessively large. The thickness of the single-layer Pt layer may range from 100 nm to 200 nm because if the Pt layer is excessively thick, the bottom width of the entire electrode may be excessively large, and severe light absorption may occur.

In some embodiments, as shown in FIG. 3, the multilayer metal structure may further include a first adhesive layer 41 and a second adhesive layer 48. The first adhesive layer 41 is located on a side of the metal reflective layer 42 away from the first barrier layer 43, and the first adhesive layer 41 of the second electrode 22 may directly contact the transparent current spreading layer. The second adhesive layer 48 is located on a side of the second barrier layer 47 away from the conductive metal layer 46. The first adhesive layer 41, the metal reflective layer 42, the first barrier layer 43, the conductive metal layer 46, the second barrier layer 47, and the second adhesive layer 48 are located on the epitaxial structure 14 in sequence in the direction from the first semiconductor layer 141 to the second semiconductor layer 143. The second adhesive layer 48 provides an adhesion function and may strengthen the connection between the insulating layer 16 and the multilayer metal structure.

The first adhesive layer 41 may include at least one metal layer between a Cr layer and a Ti layer. For instance, the first adhesive layer 41 may be a Cr layer or a Ti layer, so as to be adhered to adjacent structure layers (for example, strengthen the connection between the epitaxial structure 14 and the multilayer metal structure), improve connection tightness, and transmit light. Preferably, a thickness of the first adhesive layer 41 ranges from 0.1 nm to 10 nm.

The second adhesive layer 48 may include at least one metal layer between a Cr layer and a Ti layer. For instance, the second adhesive layer 48 may be a Cr layer or a Ti layer, so as to be adhered to adjacent structure layers, improve connection tightness, and transmit light. Preferably, a thickness of the second adhesive layer 48 ranges from 10 nm to 50 nm.

The Ti layer in the multilayer metal structure not only acts as a barrier, but also acts as a stress transition, so that the adhesion between two adjacent layers is improved. For instance, there are three Ti layers in the multilayer metal structure, and two of the Ti layers are located in the first barrier layer 43 to act as a stress transition. The first Ti layer acting as the first barrier layer 43 contacts the metal reflective layer 42. The last Ti layer acting as the first barrier layer 43 contacts the conductive metal layer 46. Another Ti layer is located between the conductive metal layer 46 and the second barrier layer 47 to act as a stress transition as well. Preferably, in the multilayer metal structure, since the lower metal layer is covered by the upper metal layer, including the case where an upper surface and a sidewall of the lower metal layer are covered by the upper metal layer, in order to ensure the covering, the thickness relationship among the multiple Ti layers is gradually increased from bottom to top (i.e., in the direction from the first semiconductor layer 141 to the second semiconductor layer 143), so that the adhesion among the layers is enhanced. For instance: among the three Ti layers, the thicknesses of the first Ti layer, the second Ti layer, and the third Ti layer in the direction from bottom to top respectively are 30 nm to 100 nm, 100 nm to 150 nm, and 150 nm to 300 nm. Preferably, the thickness of each Ti layer is not greater than 300 nm. A conductive metal layer 46 is provided between two adjacent Ti layers among the plurality of Ti layers.

In some embodiments, the flip-chip light emitting diode 10 is a small-sized flip-chip light emitting diode, such as a micro light emitting diode. Preferably, the size of the flip-chip light emitting diode 10 is less than or equal to 200 μm.

The disclosure further provides a light emitting device including the flip-chip light emitting diode 10 according to any one of the above embodiments.

In view of the foregoing, the disclosure provides a flip-chip light emitting diode 10 and a light emitting device. By using the thickest layer in the multilayer metal structure as the conductive metal layer 46 with high tensile strength, the internal thermal stress of the flip-chip light emitting diode 10 during subsequent use may be well buffered and released. Further, the current spreading in the horizontal direction is facilitated, and reliability of the device is thus be improved. By using the Al layer as the conductive metal layer 46, the electrical and thermal conductivity performance of the flip-chip light emitting diode 10 is ensured, so that the internal thermal stress of the flip-chip light emitting diode 10 during subsequent use may be well buffered and released. Further, the current spreading in the horizontal direction is facilitated, and reliability of the device is thus be improved.

In addition, a person having ordinary skill in the art shall understand that although there are many problems in the related art, each embodiment or technical solution of the disclosure can only be improved in one or several aspects, and it is not necessary to solve all the technical problems listed in the Related Art or the BACKGROUND section. It shall be understood by a person having ordinary skill in the art that anything that is not mentioned in a claim shall not be taken as a limitation on the claim.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure.

What is claimed is:

1. A flip-chip light emitting diode, comprising:
an epitaxial structure comprising a first semiconductor layer, a light emitting layer, and a second semiconductor layer, wherein the light emitting layer is located between the first semiconductor layer and the second semiconductor layer;
a first electrode located on the epitaxial structure and electrically connected to the first semiconductor layer; and
a second electrode located on the epitaxial structure and electrically connected to the second semiconductor layer,
wherein the first electrode and/or the second electrode is a multilayer metal structure, the multilayer metal structure comprises a metal reflective layer, a first barrier layer, and a conductive metal layer stacked in sequence, the metal reflective layer is located between the first semiconductor layer and the first barrier layer, a thickest layer in the multilayer metal structure is the conductive metal layer, and the conductive metal layer is an Al layer.

2. The flip-chip light emitting diode according to claim 1, wherein the first barrier layer comprises at least one metal layer among a Ti layer, a Pt layer, and a Ni layer.

3. The flip-chip light emitting diode according to claim 1, wherein a thickness of the metal reflective layer is 100 nm to 400 nm, and a thickness of the conductive metal layer is 600 nm to 1800 nm.

4. The flip-chip light emitting diode according to claim 1, wherein the multilayer metal structure further comprises a second barrier layer, and the second barrier layer is disposed on a side of the conductive metal layer away from the first barrier layer.

5. The flip-chip light emitting diode according to claim 4, wherein the second barrier layer comprises at least one metal layer among a Ti layer, a Pt layer, and a Ni layer.

6. The flip-chip light emitting diode according to claim 4, wherein the multilayer metal structure further comprises a first adhesive layer and a second adhesive layer, the first adhesive layer is located on a side of the metal reflective layer away from the first barrier layer, and the second adhesive layer is located on a side of the second barrier layer away from the conductive metal layer.

7. The flip-chip light emitting diode according to claim 6, wherein the first adhesive layer comprises at least one metal layer between a Cr layer and a Ti layer, the second adhesive layer comprises at least one metal layer between a Cr layer and a Ti layer, a thickness of the first adhesive layer ranges from 0.1 nm to 10 nm, and a thickness of the second adhesive layer ranges from 10 nm to 50 nm.

8. The flip-chip light emitting diode according to claim 1, further comprising an insulating layer, wherein the insulating layer covers the epitaxial structure and has a first opening and a second opening.

9. The flip-chip light emitting diode according to claim 8, further comprising a first pad and a second pad, wherein the first pad is located on the insulating layer and is electrically connected to the first electrode through the first opening, and the second pad is located on the insulating layer and is electrically connected to the second electrode through the second opening.

10. The flip-chip light emitting diode according to claim 1, wherein a transparent current spreading layer is disposed under the second electrode.

11. The flip-chip light emitting diode according to claim 1, wherein a size of the flip-chip light emitting diode is less than or equal to 200 μm.

12. The flip-chip light emitting diode according to claim 1, wherein the Al layer is a pure Al layer or an Al alloy layer.

13. The flip-chip light emitting diode according to claim 1, wherein the first electrode and/or the second electrode has an extension portion, and the extension portion is strip-shaped.

14. The flip-chip light emitting diode according to claim 1, wherein the multilayer metal structure comprises a plurality of Ti layers located in the first barrier layer, and thicknesses of the plurality of Ti layers gradually increase in a direction from bottom to top.

15. A light emitting device, comprising the flip-chip light emitting diode according to claim 1.

* * * * *